(12) United States Patent
Leandro

(10) Patent No.: US 9,659,730 B2
(45) Date of Patent: May 23, 2017

(54) APPARATUS AND METHOD FOR SECTIONING THE PHASE CONDUCTORS OF AN ELECTRIC POWER DISTRIBUTION NETWORK

(71) Applicant: ABB Technology AG, Zurich (CH)

(72) Inventor: Vacirca Leandro, Dalmine (IT)

(73) Assignee: ABB SCHWEIZ AG, Baden (CH)

(*) Notice: Subject to any disclaimer, the term of this patent is extended or adjusted under 35 U.S.C. 154(b) by 545 days.

(21) Appl. No.: 14/273,062

(22) Filed: May 8, 2014

(65) Prior Publication Data

US 2014/0334057 A1    Nov. 13, 2014

(30) Foreign Application Priority Data

May 10, 2013  (EP) ..................................... 13167233

(51) Int. Cl.
| | |
|---|---|
| *H02J 1/00* | (2006.01) |
| *H01H 47/00* | (2006.01) |
| *H03H 11/04* | (2006.01) |
| *H03H 11/12* | (2006.01) |
| *H02J 3/00* | (2006.01) |
| *H01H 50/00* | (2006.01) |

(52) U.S. Cl.
CPC .......... *H01H 47/001* (2013.01); *H03H 11/04* (2013.01); *H03H 11/12* (2013.01); *H01H 50/002* (2013.01); *H01H 2300/038* (2013.01); *H01H 2300/052* (2013.01); *H02J 3/00* (2013.01)

(58) Field of Classification Search
CPC .............. H01H 47/001; H01H 50/002; H01H 2300/038; H01H 2300/052; H03H 11/04; H03H 11/12; H02J 3/00
See application file for complete search history.

(56) References Cited

U.S. PATENT DOCUMENTS

| | | |
|---|---|---|
| 6,861,931 B1 | 3/2005 | Corliss et al. |
| 2011/0155698 A1 | 6/2011 | Trussler et al. |

FOREIGN PATENT DOCUMENTS

| | | | |
|---|---|---|---|
| DE | 29812347 U1 | 10/1998 | |
| DE | EP 1826789 A1 * | 8/2007 | ........... H01H 9/0072 |
| GB | 788015 A | 12/1957 | |

OTHER PUBLICATIONS

Extended European Search Report issued Jan. 22, 2014 in EP 13167233.9.

* cited by examiner

*Primary Examiner* — Daniel Cavallari
(74) *Attorney, Agent, or Firm* — Polsinelli PC

(57) ABSTRACT

The invention relates to an apparatus (50) for sectioning the phase conductors (L1, L2, L3) of a multi-phase electric power distribution network (NET) comprising a plurality of disconnectors (1, 2, 3), each disconnector being operatively associated to a related said phase conductor and comprising switching means (S) for sectioning a related phase conductor and a control unit (CU) that is capable of controlling said switching means and is capable of wireless communicating with remote devices. The control units of said disconnectors (1, 2, 3) execute different managing procedure depending on the operating status of said electric power distribution network. In a further aspect, the invention relates to a control system for executing the above described method.

20 Claims, 10 Drawing Sheets

APPARATUS AND METHOD FOR SECTIONING THE PHASE CONDUCTORS OF AN ELECTRIC POWER DISTRIBUTION NETWORK

CROSS REFERENCE TO RELATED APPLICATIONS

This application claims priority to application Ser. No. 13/167,233.9 filed in Europe on May 10, 2013 under 35 U.S.C. §119; the entire contents of all are hereby incorporated by reference.

The present invention relates to an apparatus and method for sectioning the phase conductors of an electric power distribution network.

It is known to adopt sectioning apparatuses or systems comprising disconnectors, which are operatively associated to phase conductors for sectioning the latter in physically separated and electrically insulated portions.

As is known, disconnectors cannot operate when currents (e.g. nominal currents or short-circuit currents or overload currents) flow along the phase conductors.

Currents flowing along the phase conductors are generally interrupted by properly arranged circuit breakers.

To this aim said circuit breakers may execute one or more opening/closing manoeuvres to check whether a detected fault is a permanent fault (e.g. due to a short-circuit) or a transient fault (e.g. due to the flow of in-rush currents).

Disconnectors operatively associated to different phase conductors of a power distribution network are generally required to switch (opening manoeuvre of the electric contacts) simultaneously at a given intervention instant, thereby avoiding unbalances of the phase conductors and ensuring a proper coordination with the operation of the main circuit breaker.

Most traditional sectioning apparatuses comprise disconnectors provided with electric contacts that are moved by a common driving bar, which is in turn actuated by properly arranged actuating means commanded by a control unit (e.g. a relay).

These solutions are often quite expensive to produce at industrial level and bulky to install on the field.

Other known sectioning apparatuses include disconnectors having control units capable of mutually communicating, particularly in a wireless manner.

When the intervention of the disconnectors is required, the control unit of a predefined disconnector sends an opening command to the control units of the other disconnectors. In this way, it is possible to obtain a synchronized switching of all the disconnectors, even if these latter are mechanically separated one from the other.

Currently available apparatuses of this type are not able to properly manage the operation of the disconnectors as a function of the actual operative conditions of the power distribution network, e.g. depending on whether in-rush currents (transient fault) or short-circuit currents (permanent fault) are flowing along the phase conductors.

These problems are more evident when critical time conditions must be satisfied, typically due to the fact that the operation of the disconnectors must be coordinated within the re-closing time of the main circuit breaker (typically 500 ms).

Further, these apparatuses show remarkable problems in terms of reliability since the synchronization process of the disconnectors may be easily jeopardized by errors in communication among the control units or by hardware/software malfunctioning.

In the market, it is thus still felt the need for technical solutions that are capable of overcoming the drawbacks of the state of the art described above.

In order to respond to this need, the present invention provides an apparatus for sectioning the phase conductors of a multi-phase electric power distribution network, according to the following claim 1 and the related dependent claims.

In a further aspect, the present invention relates to a method for sectioning the phase conductors of a multi-phase electric power distribution network, according to the following claim 8 and the related dependent claims.

Further characteristics and advantages of the present invention shall emerge more clearly from the description of preferred but not exclusive embodiments thereof, illustrated purely by way of example and without limitation in the attached drawings, in which.

With reference to the mentioned figures, in a first aspect, the present invention relates to an apparatus 50 for sectioning the phase conductors L1, L2, L3 of a multi-phase electric power distribution network NET (preferably of the three-phase type).

The power distribution network NET can operate at low or medium voltages.

Within the framework of the present invention the term "low voltage" relates to voltages lower than 1 kV AC and 1.5 kV DC while the term "medium voltage" relates to voltages lower than 72 kV AC and 100 kV DC.

The disconnecting apparatus 50 comprises a plurality of disconnectors 1, 2, 3, namely one disconnector operatively associated to each phase conductor L1, L2, L3.

Each disconnector 1, 2, 3 is advantageously adapted to section the phase conductor L1, L2, L3 to which it is operatively associated in order to physically separate and electrically insulated upstream and downstream portions (referring to the position of the disconnector) thereof.

Each disconnector 1, 2, 3 is advantageously adapted to section the related phase conductor L1, L2, L3 only when certain operative conditions are present in the power distribution network NET.

Within the framework of the present invention the term "normal conditions" relates to the customary operative conditions of the power distribution network NET, e.g when transient or permanent faults are not present.

Further, the term "non-sectioning conditions" relates to faulty operative conditions of the power distribution network NET, in which the disconnectors 1, 2, 3 cannot intervene to section the related phase conductors.

As an example, non-sectioning conditions are present when a fault occurs but the main circuit breaker CB has not yet performed a sufficient number of opening manoeuvres to allow the disconnectors 1, 2, 3 to intervene.

Further, the term "sectioning conditions" relates to faulty operative conditions of the power distribution network NET, in which the disconnectors 1, 2, 3 can intervene to section the related phase conductors.

As an example, sectioning conditions may be present when a fault occurs and the main circuit breaker CB has performed a sufficient number of opening manoeuvres to allow the disconnectors 1, 2, 3 to intervene.

Figure 1:
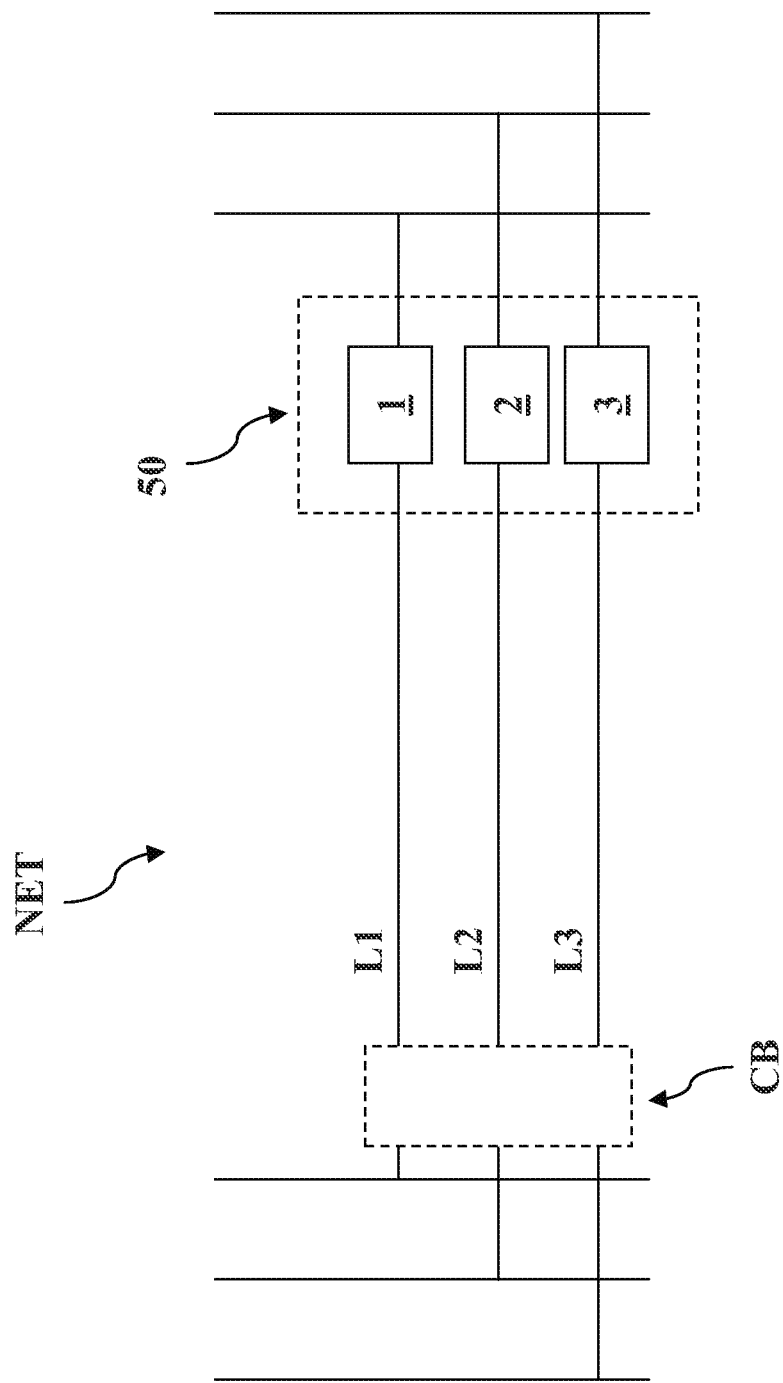
FIG. 1-2 are diagrams that schematically illustrate the apparatus, according to the present invention.
Figure 2:
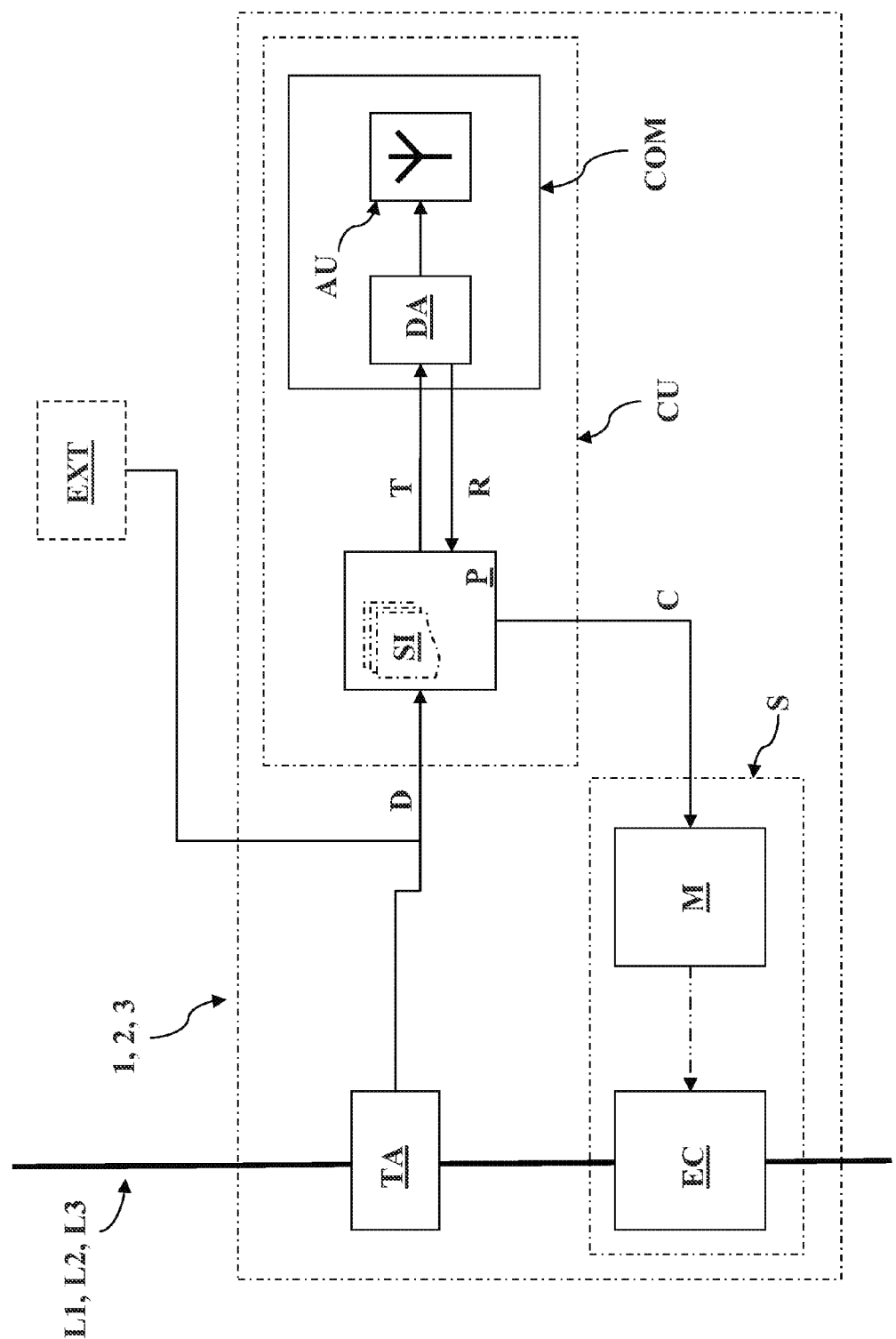

FIG. 2 schematically illustrates the structure of a disconnector 1, 2, 3.

Each disconnector 1, 2, 3 comprises switching means S for sectioning the related phase conductor L1, L2, L3.

Preferably, the switching means S comprise electric contacts EC (typically a fixed contact and a movable contact) that are electrically connected to the related phase conductor L1, L2, L3 and that can be mutually coupled and separated.

The electric contacts EC are advantageously arranged so that, when they are mutually separated, upstream and downstream portions (referring to the position of said electric contacts) of the related phase conductors L1, L2, L3 are physically separated and electrically insulated.

Preferably, the switching means S comprise actuating means M to actuate the electric contacts EC, in particular the movable contacts thereof.

The actuating means M may comprise an electro-mechanical actuator (not shown) that is tripped by command signals C and a kinematic chain (not shown) that operatively connects said actuator with the electric contacts EC.

Preferably, each disconnector 1, 2, 3 comprises sensing means TA of the currents flowing along the phase conductor L1, L2, L3 that is operatively associated with the disconnector. The sensing means TA preferably comprises for each phase conductor L1, L2, L3 a current sensor (not shown), e.g. a current transformer, and an interface circuit (not shown), which is operatively associated with said current sensor to receive measuring signals from this latter and provide output data signals related to the currents flowing along the related phase conductor.

Each disconnector 1, 2, 3 comprises a control unit CU, which preferably comprises digital processing means P (for example a microcontroller).

The digital processing means P execute software instruction SI for managing the operating life of the control unit CU, e.g. for acquiring/transmitting data, processing data and/or for generating/receiving command signals.

Preferably, software instructions SI are stored in a permanent memory of the digital processing means P or they may be uploaded in a suitable memory of the digital processing means P from a remote memory location.

The control unit CU is capable of wireless communicating with other remote devices (not shown in FIG. 2), e.g. with the control units of other disconnectors, Intelligent Control Devices (IEDs), relays, SCADA systems or the like.

The control unit CU preferably comprises a communication module COM for managing the wireless communication with said remote devices, e.g. by means of suitable communication protocols such as Zigbee™, Bluetooth™ or the like.

The communication module COM is controlled by the digital processing means P and can interact with these latter for managing the wireless communication with the remote devices.

Within the framework of the present invention, it is intended that:
- the control unit CU is in a "transmission mode", when the communication module COM is enabled to wireless transmit data packages towards the remote devices;
- the control unit CU is in a "receiving mode", when the communication module COM is enabled to wireless receive data packages from the remote devices;
- the control unit CU is in a "turn off mode", when the communication module COM is not enabled to wireless receive/transmit data packages from/to the remote devices.

As described in the following, a control unit CU may switch between these different operative modes concerning the wireless communication with the remote devices.

The communication module COM preferably comprises an antenna unit AU and a driving circuit DA that interfaces with the antenna unit AU, in particular for sending/receiving transmission/reception signals to/from this latter.

The digital processing means P are adapted to generate first output signals T for the driving circuit DA.

The output signals T may comprise command signals for the driving circuit DA and/or data signals (e.g. data packages) to be transmitted by the driving circuit DA via the antenna unit AU.

The digital processing means P are adapted to receive first input signals R from the driving circuit DA.

The input signals R may comprise command signals and/or data signals (e.g. data packages) for the digital processing means P, which have been generated by the driving circuit DA and/or which have been received from remote devices by the driving circuit DA, via the antenna unit AU.

The control unit CU is operatively connected (preferably in a wired manner) to the sensing means TA and/or other external devices EXT, e.g. Intelligent Electronic Devices (IEDs), relays, further control devices, SCADA systems or the like (in wired or wireless manner).

Preferably, the digital processing means P are adapted to receive second input signals D from the sensing means TA and/or from the external devices EXT (in wired or wireless manner).

The input signals D may comprise command signals and/or data signals, e.g. data signals related to the currents flowing along the phase conductors L1, L2, L3 or, more generally, related to the operating status of the power distribution network NET.

The control unit CU is operatively connected to the switching means S and is capable of controlling the actuating means M to command the maneuvers of the electric contacts EC, in particular the sectioning of the phase conductors L1, L2, L3 (opening manoeuvre of the electric contacts EC).

To this aim, the digital processing means P generate command signals C for the switching means S, in particular for the actuating means M.

Preferably, the power distribution network NET comprises at least the main circuit breaker CB to interrupt the currents flowing along the phase conductors L1, L2, L3.

When a fault is detected, the main circuit breaker CB may advantageously execute opening/closing maneuvers to check whether the detected fault is a permanent fault (e.g. due to a short-circuit) or a transient fault (e.g. due to the flow of in-rush currents).

Since the disconnectors 1, 2, 3 can only operate when sectioning conditions are present, they must properly coordinate their operation with the operation of the circuit breaker CB.

In particular, when a fault event is present, it is important that the disconnectors 1, 2, 3 properly intervene within an execution time frame T that is shorter than an opening/closing cycle of the main circuit breaker CB (e.g. at least 500 ms).

According to the invention, the control units CU of the disconnectors 1, 2, 3 are capable of executing procedures 101, 102, 103 for managing the operation of such disconnectors in relation to the operating conditions of the power distribution network NET.

In order to execute the managing procedures 101, 102, 103, the digital processing means P of the control unit of each disconnector 1, 2, 3 execute suitable sets of software instructions SI.

As it will be better described in the following, during the execution of said managing procedures, the control units of the disconnectors 1, 2, 3 need to wireless communicate one with another in order to exchange data packages of various types.

Preferably, said data packages are in an encrypted form.

The processing means P of the control unit CU of each disconnector 1, 2, 3 encrypt the data packages to be transmitted by means of a public key that is stored in the processing means P.

On the other hand, the processing means P of the control unit CU of each disconnector 1, 2, 3 decrypt the data packages received from the control units of the other disconnectors by means of a private key that is stored in the processing means P.

In this way, it is possible to avoid or reduce communication interferences between the control units of disconnectors comprised in different sectioning apparatuses 50, operatively associated to different sections of the power distribution network NET.

In order to execute the managing procedures 101, 102, 103, the control units CU of the disconnectors 1, 2, 3 need to acquire and process data related to the operating status of the power distribution network NET.

Preferably, the control units CU of the disconnectors 1, 2, 3 execute a determination procedure 105, during which the control unit of each disconnectors 1, 2, 3 acquires data DS related to the operating status of the power distribution network NET and determines the operating status of this latter on the basis of the data DS.

The data DS are acquired by the control unit CU of each disconnector 1, 2, 3 through the data signals D received from the sensing means TA and/or the external device EXT operatively connected with said control unit.

Preferably, the determination procedure 105 is repeated by the control unit CU of each disconnector 1, 2, 3, e.g. every zero crossing of the phase voltage of the phase conductors L1, L2, L3 (e.g. 20 ms) or every given number of cycles of the internal clock.

Advantageously, the repetition period of the determination procedure 105 is very shorter (preferably less than 10%) with respect to the execution time frames T of the managing procedures 101, 102 or 103.

In order to execute the determination procedure 105, the digital processing means P of the control unit of each disconnector 1, 2, 3 execute suitable software instructions SI.

According to the invention, the control units CU of the disconnectors 1, 2, 3 execute different managing procedures 101, 102, 103 of the operation of said disconnectors when different operating conditions of the power distribution network NET are present.

If the control unit CU of each disconnector 1, 2, 3 determines the occurrence of normal conditions for the power distribution network NET, the control units of the disconnectors 1, 2, 3 execute a normal-condition procedure 101.

If the control unit CU of at least one disconnector (e.g. the disconnector 2) determines the occurrence of a fault event and the occurrence of non-sectioning conditions for the power distribution network NET, the control units of the disconnectors 1, 2, 3 execute a non-sectioning procedure 102.

If the control unit CU of at least one disconnector (e.g. the disconnector 2) determines the occurrence of a fault event and the occurrence of sectioning conditions for the power distribution network NET, the control units of the disconnectors 1, 2, 3 execute a sectioning procedure 103.

The managing procedures 101, 102 or 103 are executed during subsequent execution time frames T, which may have different duration.

Each execution time frame T is preferably shorter than the opening/closing cycle of the main circuit breaker CB, for the reasons mentioned above.

Preferably, the execution time frames T of the managing procedures 101, 102, or 103 are shorter than 200 ms.

Figure 3:
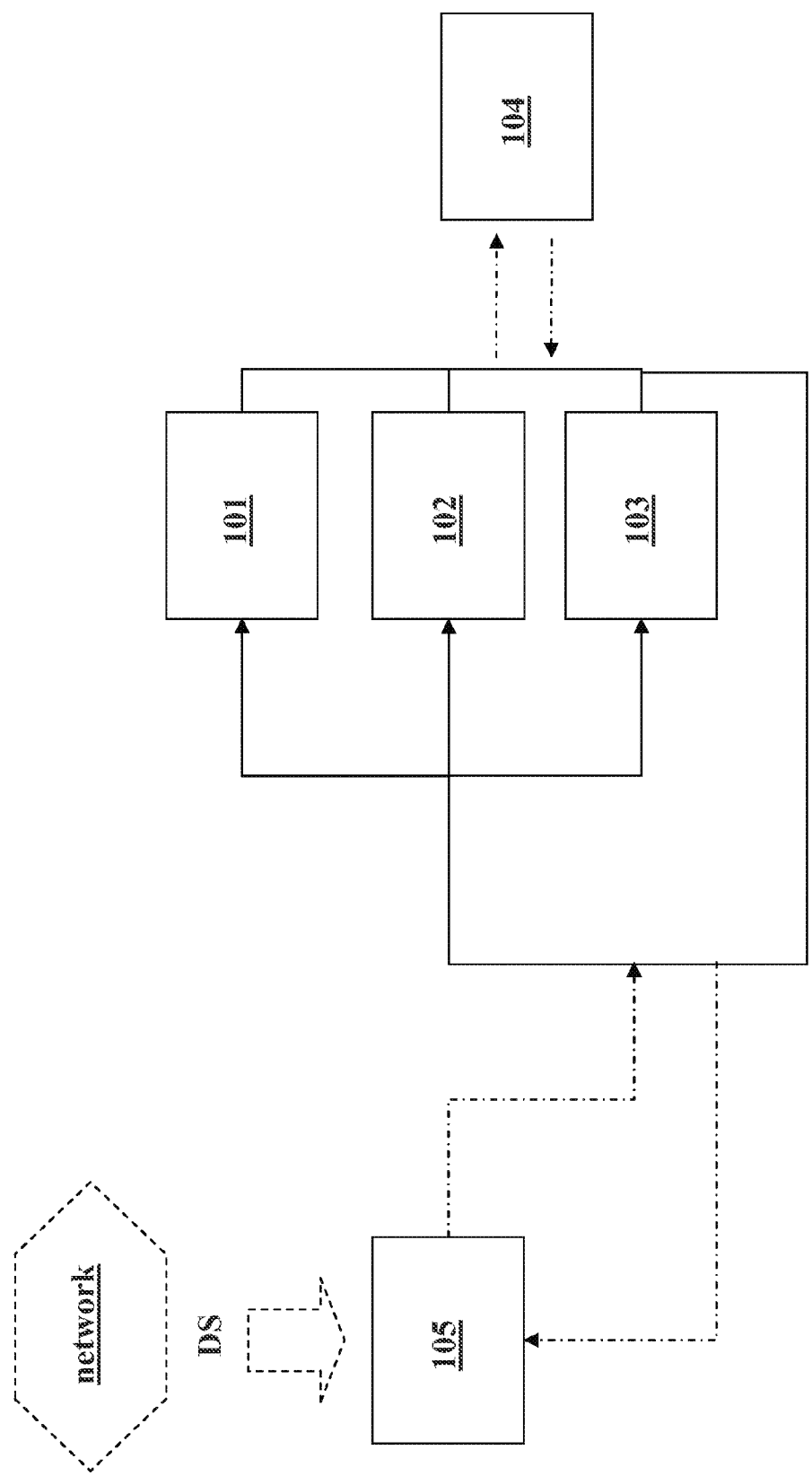
FIG. 3-10 are diagrams that schematically illustrate some steps of the operation of the apparatus, according to the present invention, and of the method thereof.
Figure 4:
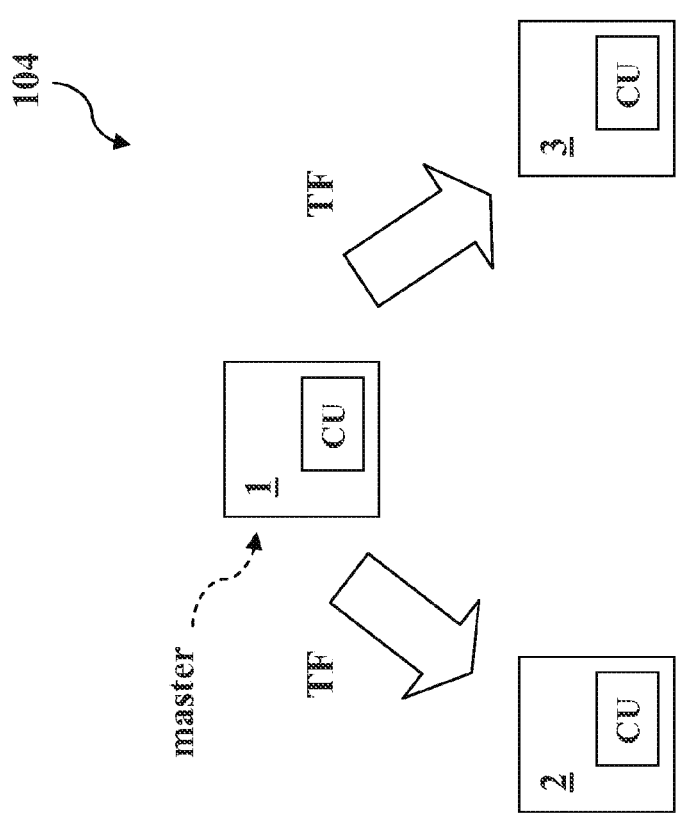
Figure 5:
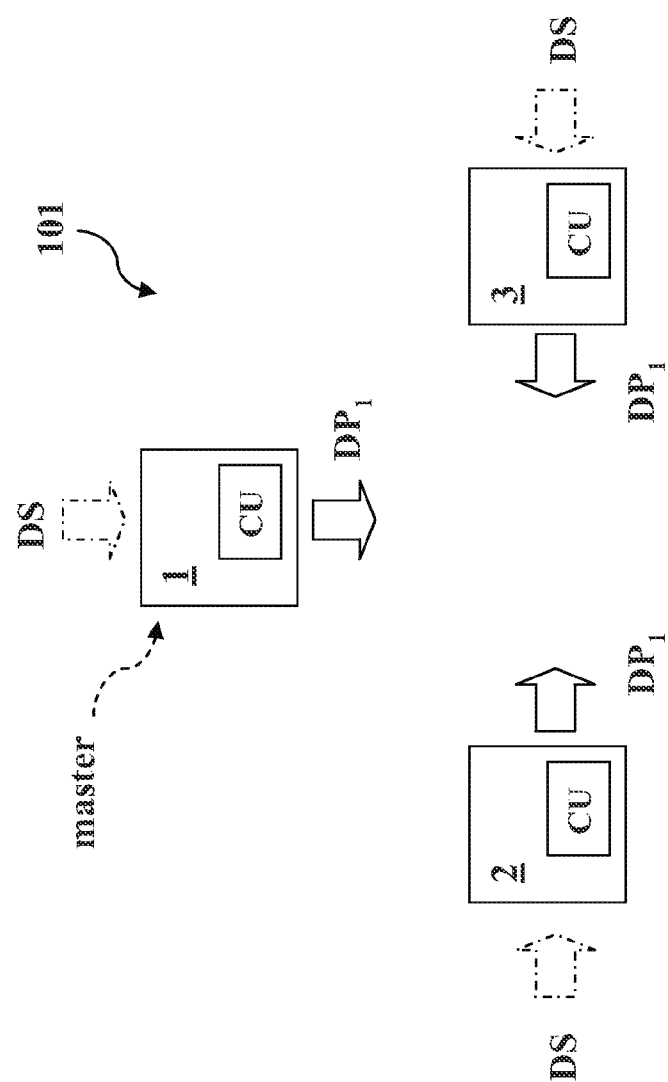

During the normal-condition procedure 101 (FIGS. 3, 5-6), the control unit CU of each disconnector 1, 2, 3 switches in turn between a transmission mode, in which said control unit broadcasts first data packages $DP_1$, and a turn-off mode, in which said control unit does not transmit or receive data packages from the control units of the other disconnectors.

Preferably, the data packages $DP_1$ broadcasted by the control unit of each disconnector 1, 2, 3 are indicative of the operating conditions of said control unit and/or of the operating conditions of the power distribution network NET.

Preferably, a SCADA system (not shown) is operatively associated to the sectioning apparatus 50, so as to be capable of receiving the data packages broadcasted by the control units of the disconnectors 1, 2, 3.

The broadcasted data packages $DP_1$ are preferably received also by said SCADA system, which is thus capable of monitoring the operating status of the disconnectors 1, 2, 3 and, more in general, the operating status of the power distribution network NET by wireless communicating with the control units of the disconnectors 1, 2, 3.

Preferably, in the normal-condition procedure 101, the control unit of each disconnector 1, 2, 3 switches in turn in the transmission mode to broadcast the data packages $DP_1$ for a first predefined time frame T1 and in the turn-off mode for a second predefined time frame T2.

Figure 6:
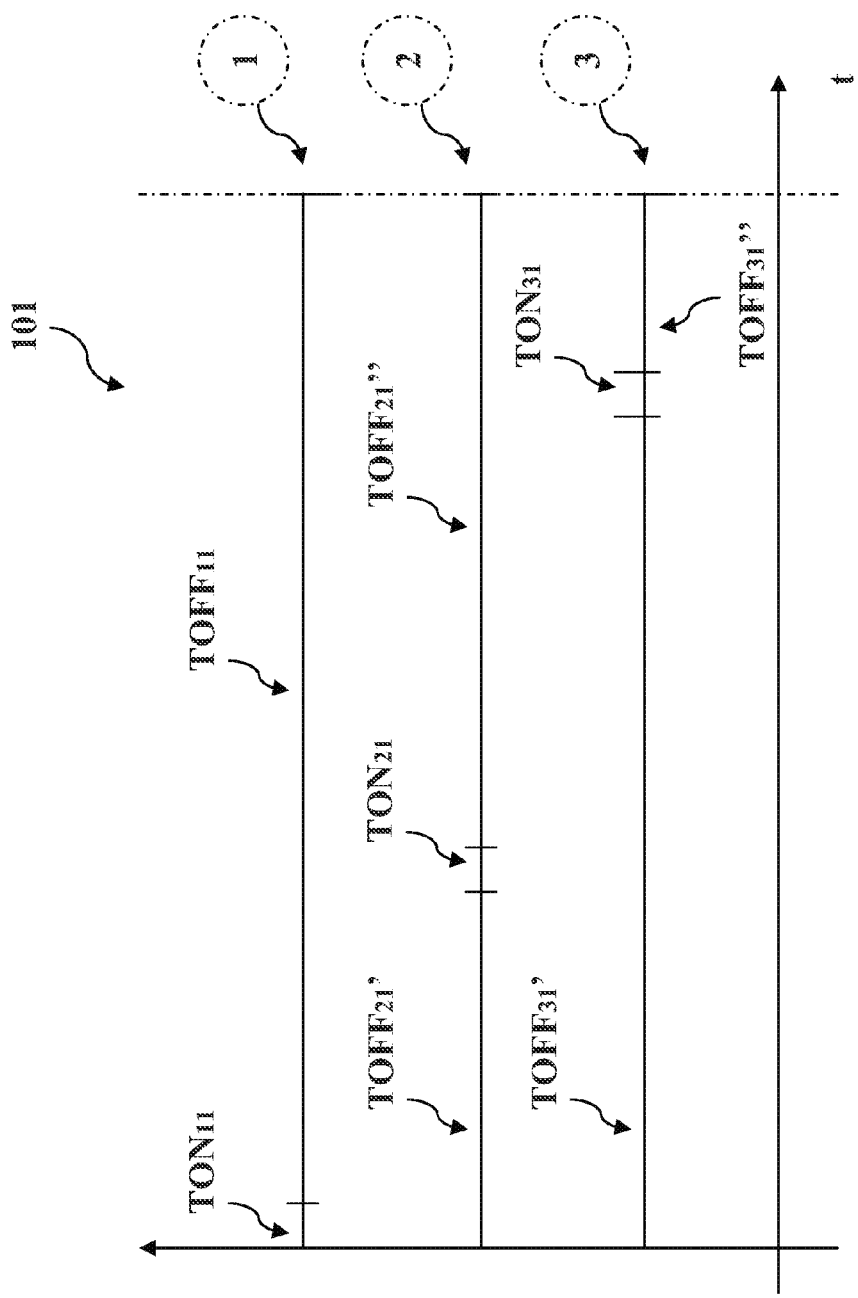

As shown in FIG. 6, in the normal-condition procedure 101, the control unit CU of each disconnector 1, 2, 3 performs a switching cycle between the transmission mode and the turn-off mode, which is properly synchronized with the switching cycles performed by the control units of the other disconnectors in order to avoid collisions during the transmission of the data packages $DP_1$.

The control units CU of each disconnector 1, 2, 3 thus switches in the transmission mode (and therefore in the receiving mode), according to a predefined time sequence that is preferably of the TDM (Time-Division Multiplexing) type (logical bus topology).

Such time sequence is started by the control unit of a predefined disconnector (e.g. the disconnector 1), which in this case operates as master device.

Referring to FIG. 6, it can be observed that:
- for the disconnector 1, the transmission time frame is T1=$TON_{11}$ while the turn-off time frame is T2=$TOFF_{11}$;
- for the disconnector 2, the transmission time frame is T1=$TON_{21}$ while the turn-off time frame is T2=$TOFF_{21}'+TOFF_{21}''$;
- for the disconnector 3, the transmission time frame is T1=$TON_{31}$ while the turn-off time frame is T2=$TOFF_{31}'+TOFF_{31}''$.

It can be observed that transmission time frame of the disconnector 2 is delayed with respect of the transmission time frame of the disconnector 1 of the time interval $TOFF_{21}'$.

It can be observed that transmission time frame of the disconnector 3 is delayed with respect of the transmission time frame of the disconnector 1 of the time interval $TOFF_{31}'>TOFF_{21}'$.

In order to reduce energy consumption, the control unit of each disconnector 1, 2, 3 performs a switching cycle having a duty cycle value $DC=T1/(T1+T2)$ that is less than 2%, where T1, T2 are the transmission and turn-off time frames, respectively.

Since the duty cycle value DC is quite low, it is noticed that, during the normal-condition procedure 101, there are relatively long intervals of the execution time frame T, in which all the control units CU of the disconnectors 1, 2, 3 are in a turn-off mode.

This is quite advantageous to ensure a proper synchronization of the transmission time frame in order to avoid collisions during the transmission of the data packages $DP_1$.

Preferably, the normal-condition procedure 101 is repeated by the control units CU of the disconnectors 1, 2, 3 during each execution time frame T, until the occurrence of a fault event is determined by the control unit of at least one disconnector 1, 2, 3.

In this case, the control units of the disconnectors 1, 2, 3 stop the procedure 101 and start executing the non-sectioning procedure 102 or the sectioning procedure 103 if the occurrence of non-sectioning or sectioning conditions for the power distribution network NET is determined, respectively.

Figure 7:
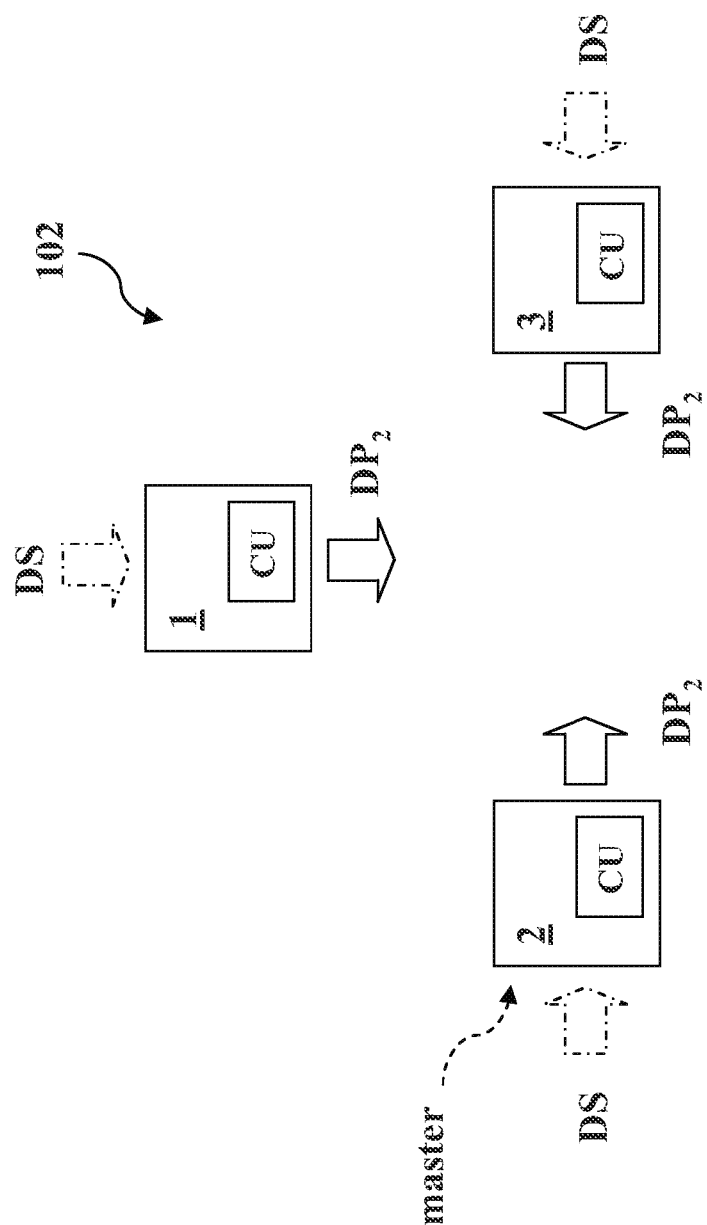

During the non-sectioning procedure 102 (FIGS. 3, 7-8), the control unit CU of each disconnector 1, 2, 3 switches in turn between a transmission mode, in which said control unit broadcasts second data packages $DP_2$, and a receiving mode, in which said control unit waits for receiving the second data packages $DP_2$ broadcasted by the control units of the other disconnectors.

Preferably, the data packages $DP_2$ broadcasted by the control unit CU of each disconnector 1, 2, 3 are indicative of the operating conditions of said control unit and/or the power distribution network NET.

In particular, the data packages $DP_2$ are informative that the occurrence of a fault event and the occurrence of non-sectioning conditions have been determined by said control unit.

Also in this case, the broadcasted data packages $DP_2$ can be received by a SCADA system operatively associated with the sectioning apparatus 50 to monitor the operating status of the disconnectors 1, 2, 3 and, more in general, the operating status of the power distribution network NET.

Figure 8:
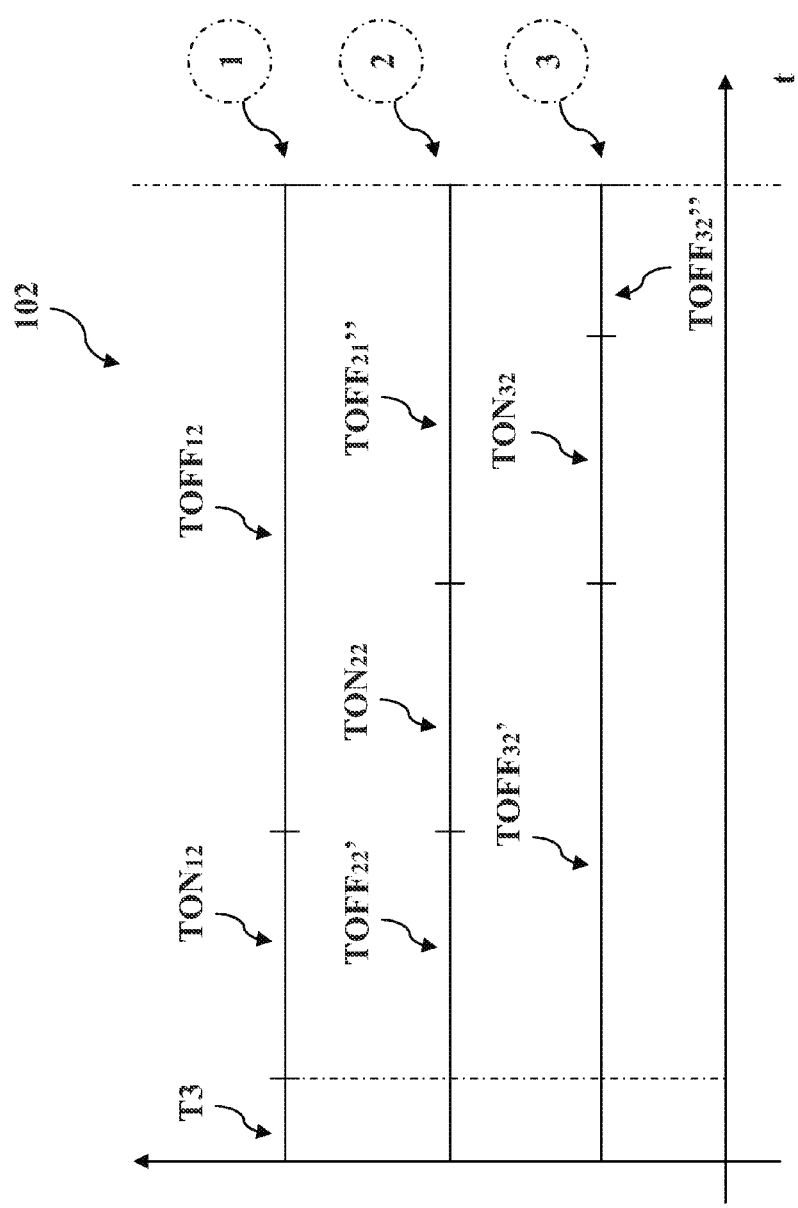

Preferably, in the non-sectioning procedure 102, all the control units of the disconnectors 1, 2, 3 initially switch simultaneously in a receiving mode for a predefined third time frame T3 (FIG. 8).

During the time frame T3, the control unit of each disconnector 1, 2, 3 advantageously waits to receive possible data related to the operative status of the control units of the other disconnectors and/or the operative status of power distribution network NET.

As an example, the control unit of each disconnector 1, 2, 3 waits to receive possible tripping-request data packages TRQ broadcasted by the control units of the other disconnectors.

Preferably, in the non-sectioning procedure 102, after the time frame T3 has elapsed, the control unit of each disconnector 1, 2, 3 switches in turn in the transmission mode for a fourth predefined time frame T4 and switches in turn in the receiving mode for a fifth predefined time frame T5.

As shown in FIG. 8, also in the non-sectioning procedure 102, the control unit CU of each disconnector 1, 2, 3 performs a switching cycle between the transmission mode and the turn-off mode, which is properly synchronized with the switching cycles performed by the control units of the other disconnectors in order to avoid collisions during the transmission of the data packages $DP_1$.

The control unit CU of each disconnector 1, 2, 3 switches in the transmission mode (and therefore in the receiving mode) preferably following a time sequence of the TDM type.

Such a time sequence is started by the control unit that has first determined the occurrence of a fault (e.g. the control unit of the disconnector 2), which in this case operates as master device.

Referring to FIG. 8, advantageously:

for the disconnector 1, the transmission time frame is $T4=TON_{12}$ while the turn-off time frame is $T5=TOFF_{12}$;

for the disconnector 2, the transmission time frame is $T4=TON_{22}$ while the turn-off time frame is $T5=TOFF_{22}'+TOFF_{22}''$;

for the disconnector 3, the transmission time frame is $T4=TON_{32}$ while the turn-off time frame is $T5=TOFF_{32}'+TOFF_{32}''$.

Advantageously, the transmission time frame of the disconnector 2 is delayed with respect to the transmission time frame of the disconnector 1 of the time interval $TOFF_{22}'$.

Advantageously, the transmission time frame of the disconnector 3 is delayed with respect of the transmission time frame of the disconnector 1 of the time interval $TOFF_{32}'>TOFF_{22}'$.

Preferably, the non-sectioning procedure 102 is repeated by the control units CU of the disconnectors 1, 2, 3, until the occurrence of sectioning conditions is determined by the control unit of at least one disconnector 1, 2, 3 or until the occurrence of normal conditions is determined by the control units of all the disconnectors 1, 2, 3.

The control units CU of the disconnectors 1, 2, 3 stop the procedure 102 and start executing the sectioning procedure 103 if the occurrence of sectioning conditions for the power distribution network NET is determined by the control unit of at least one disconnector 1, 2, 3.

The control units CU of the disconnectors 1, 2, 3 stop the procedure 102 and start executing the normal-condition procedure 101 if the occurrence of normal conditions for the power distribution network NET is determined by the control units of all the disconnectors 1, 2, 3.

Figure 9:
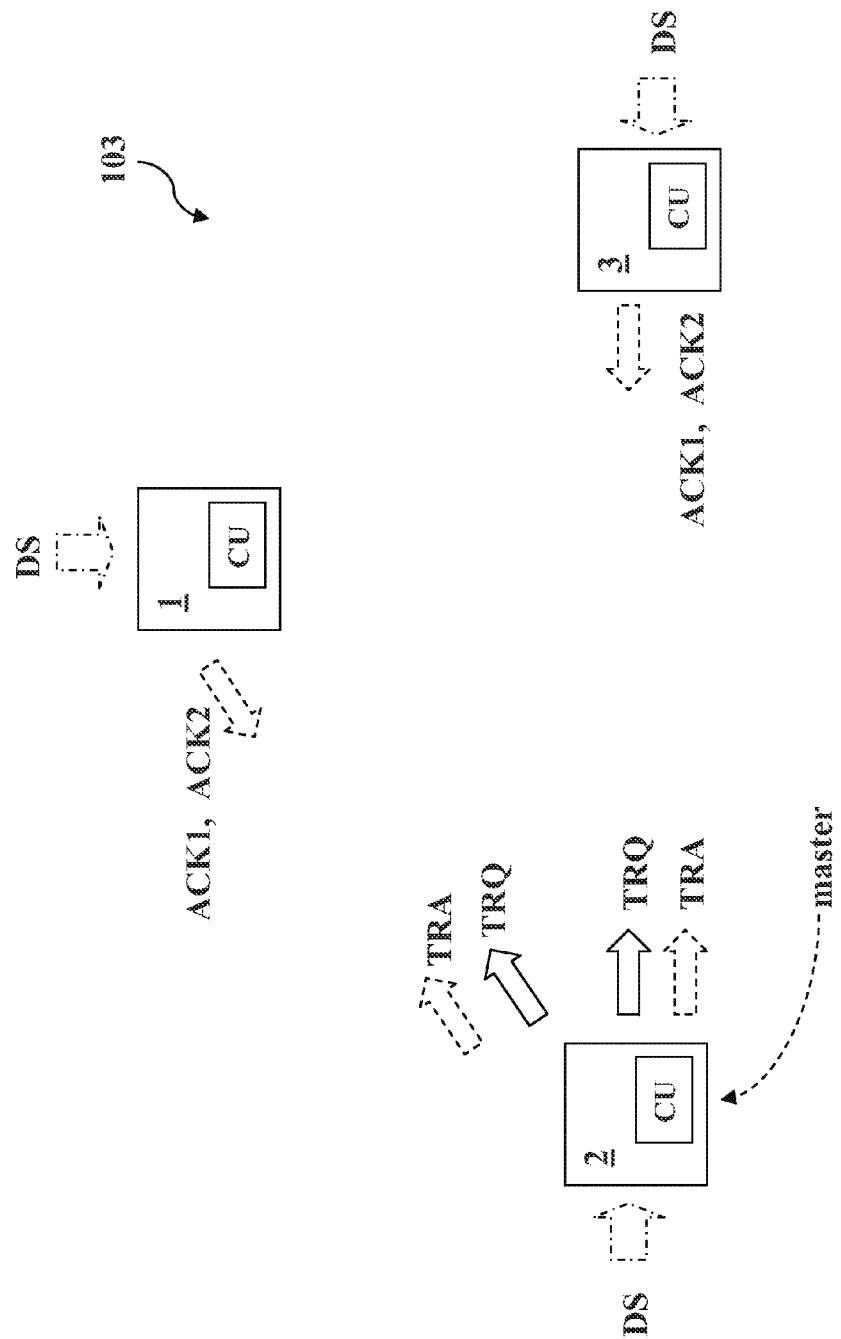
Figure 10:
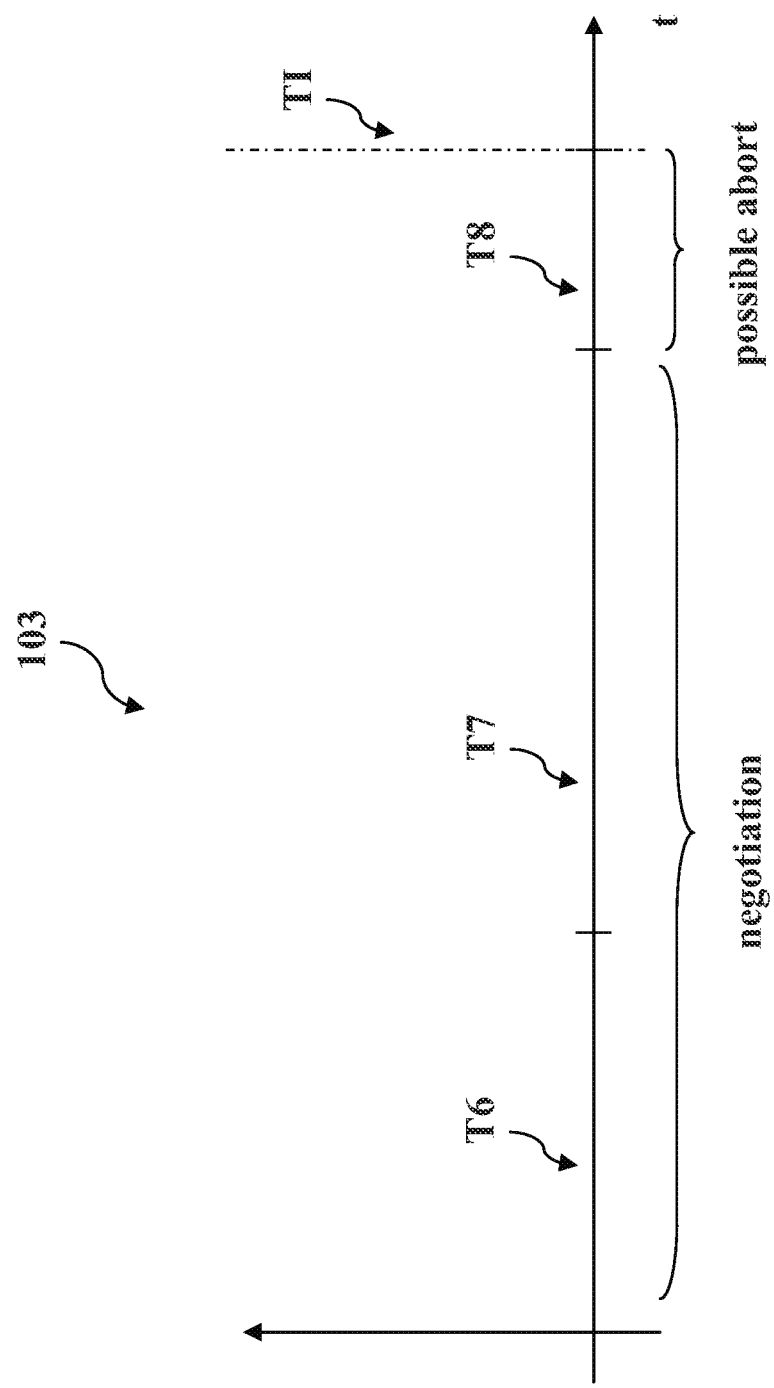

During the sectioning procedure 103 (FIGS. 3, 9-10), the control unit (e.g. the control unit of the disconnector 2) that has determined the occurrence of the fault event (in the following referred to as "master control unit") operates as a master device and it coordinates the operation of the control units of the other disconnectors 1, 3 (in the following referred to as "the other control units"), in such a way that the control units of all the disconnectors 1, 2, 3 synchronously command the sectioning of the related phase conductors L1, L2, L3 at a predetermined intervention time TI, if this is possible.

In particular, the master control unit coordinates a negotiation with the other control units to check whether all said control units are capable of simultaneously commanding the sectioning of the related phase conductors L1, L2, L3 at the predetermined intervention time TI.

The negotiation between the master control unit and the other control units may come to a positive or negative conclusion.

Depending on the results of said negotiation, it will be possible or impossible for said control units to simultaneously command the sectioning of the related phase conductors L1, L2, L3 at the intervention time TI.

In the sectioning procedure 103, the master control unit initially switches in a transmission mode to broadcast tripping-request data packages TRQ for a sixth predefined time frame T6 (e.g. 80 ms).

In this way, the master control unit requests the other control units to simultaneously command the sectioning of the related phase conductors L1, L2, L3 at the intervention instant TI.

The master control unit continuously broadcasts the tripping-request data packages TRQ during the time frame T6.

When the time frame T6 has elapsed, the master control unit switches in a receiving mode for a seventh predefined time frame T7 (e.g. 100 ms).

During the time frame T7, the master control unit waits to receive a response to the broadcasted tripping-request data packages TRQ. In particular, the master control unit waits to receive response data packages ACK1 or ACK2 from the other control units.

The other control units may switch in a transmission mode to send positive-response data packages ACK1 or negative-response data packages ACK2.

In this way, they can communicate to the master control unit that they are ready or not ready to command the sectioning of the related phase conductor L1, L3 at the intervention instant TI.

As an example, a control unit may send negative-response data packages ACK2, if it determines that there is still a current flowing along the related phase conductor (it is thus not possible to operate the sectioning) or in case of software/hardware malfunctioning while it may send positive-response data packages ACK1, if it determines that sectioning conditions are actually present in the power distribution network NET.

It might happen that the other control units send no response data packages to the master control unit. As an example, this may occurs in case of communication errors or in case of software/hardware malfunctioning.

If negative-response data packages ACK2 or no data packages are received from the other control units within the time frame T7, the master control unit switches in a transmission mode to broadcast trip-abort data packages TRA to the other control units during a time frame T8 (e.g. 20 ms), which is comprised between the end of the time frame T7 and the intervention instant TI.

In this way, the master control unit requests the other control units to disregard the previously broadcasted tripping-request data packages TRQ and not to command the sectioning of the related phase conductor L1, L3 at the intervention instant TI.

During the time frame T8, the master control unit continuously broadcast the trip-abort data packages TRA, which do not need to be acknowledged by the other control units.

If the trip-abort data packages TRA are broadcasted by the master control unit, the control units of all the disconnectors 1, 2, 3 do not command the sectioning of the related phase conductors L1, L2, L3 at the intervention instant TI.

After the intervention instant TI has elapsed, the sectioning procedure 103 is repeated for a further execution time frame T, if sectioning conditions are again determined by the control unit of at least one disconnector 1, 2, 3.

Advantageously, the next execution time frame T a different control unit CU may operate as master device.

If normal conditions are determined by all the control units of the disconnectors 1, 2, 3, the control units of the disconnectors 1, 2, 3 stop the procedure 103 and start executing the normal-condition procedure 101.

If non-sectioning conditions are determined by all the control units of all the disconnectors 1, 2, 3, the control units of the disconnectors 1, 2, 3 stop the procedure 103 and start the non-sectioning procedure 102.

If positive-response data packages ACK1 are received from the other control units within the time frame T7, the master control unit and the other control unit command the sectioning of the related phase conductor L1, L2, L3 at the intervention instant TI.

The sectioning is commanded if no further trip-abort data packages TRA are broadcasted by the master control unit during the time frame T8.

In practice, even if the control units of the disconnectors 1, 2, 3 have negotiated and agreed to command the sectioning of the phase conductors L1, L2, L3 at the intervention instant TI, there is still the possibility of stopping the sectioning of the phase conductors, if the master control unit determines that the operating conditions of the power distribution network NET so require.

In this case, the master control unit switches in the transmission mode to continuously broadcast trip-abort data packages TRA, so that the control units of the disconnectors 1, 2, 3 do not command the sectioning of the related phase conductors L1, L2, L3 at the intervention instant TI.

After the intervention instant TI has elapsed, the control units of the disconnectors 1, 2, 3 repeat the sectioning procedure 103 or execute the normal-condition procedure 101 or the non-sectioning procedure 102, depending on the conditions of the power distribution network NET.

Preferably, the control units CU of the disconnectors 1, 2, 3 execute a synchronization procedure 104 to synchronize their internal clocks.

In order to execute the synchronization procedure 104, the digital processing means P of the control unit of each disconnector 1, 2, 3 execute suitable software instructions SI.

The synchronization procedure 104 is advantageously executed at the beginning of the operation of the sectioning apparatus 50 or cyclically repeated or executed according to the needs in order to prevent the raising of time drifts among the internal clocks of the control units of the disconnectors 1, 2, 3.

During the synchronization procedure 104, the control unit CU of a predefined disconnector (e.g. the disconnector 1) operates as master device and switches in the transmission mode to broadcast synchronization data packages TF for a given period of time (e.g. for 100 clock cycles of its internal clock).

The control units CU of the other disconnectors 2, 3 switch in a receiving mode to receive the synchronization data packages TF.

Then the control units of the disconnectors 2, 3 synchronize their internal clocks on the base of the received synchronization data packages TF.

If the occurrence of fault event is determined by the control unit CU of at least one disconnector 1, 2, 3 during the execution of the synchronization procedure 104, the control units CU of the disconnectors 1, 2, 3 stop the synchronization procedure and execute one of the managing procedures 102 or 103 depending on the operative conditions of the power distribution network NET.

In a further aspect, the present invention relates to a method for sectioning the phase conductors of a multi-phase electric power distribution network NET.

The method of the invention comprises a step of providing the plurality of disconnectors 1, 2, 3, each disconnector being operatively associated to a related phase conductor.

As described above, each disconnector 1, 2, 3 comprises the switching means S for sectioning a related phase conductor and a control unit CU that is capable of controlling the switching means S and wireless communicating with remote devices.

Preferably, the control unit CU comprises the digital processing means P and a communication module that is operatively connected with said processing means.

The method of the invention comprises the steps of:
executing the normal-condition procedure 101, if the control unit of each disconnector 1, 2, 3 determines the occurrence of normal conditions for the power distribution network NET;
executing the non-sectioning procedure 102, if the control unit of one disconnector determines the occurrence of a fault event and the occurrence of non-sectioning conditions for the power distribution network NET;
executing the sectioning procedure 103, if the control unit of one disconnector determines the occurrence of a fault event and the occurrence of sectioning conditions for the power distribution network NET.

Preferably, the method of the invention comprises the step of executing the synchronization procedure 104.

Preferably, during the synchronization procedure 104:
the control unit of a predefined disconnector 1 switches in the transmission mode to broadcast synchronization data packages TF for a predetermined period of time;
the control units of the other disconnectors 2, 3 receive the synchronization data packages TF from the control unit of the predefined disconnector 1 and synchronize their internal clocks on the base of the synchronization data packages TF.

Preferably, the method of the invention comprises the step of executing the determination procedure 105.

Preferably, during the normal-condition procedure 101, the control unit of each disconnector 1, 2, 3 switches in turn in the transmission mode for a first predefined time frame T1 and switches in turn in the turn-off mode for a second predefined time frame T2.

Preferably, the control unit of each disconnector 1, 2, 3 performs a switching cycle between the transmission mode and the turn-off mode, which has a duty cycle value DC=T1/(T1+T2) that is less than 2%, where T1, T2 are the first and second time frames.

Preferably, during the non-sectioning procedure 102 all the control units of the disconnectors 1, 2, 3 simultaneously switch in the receiving mode for a predefined third time frame T3.

Preferably, after the third time frame T3 has elapsed:
the control unit of each disconnector 1, 2, 3 switches in turn in the transmission mode for a fourth predefined time frame T4;
the control unit of each disconnector 1, 2, 3 switches in turn in the receiving mode for a fifth predefined time frame T5.

Preferably, during the sectioning procedure 103:
the control unit of the disconnector 2 that has determined the occurrence of the fault event switches in the transmission mode to broadcast tripping-request data packages TRQ for a sixth predefined time frame T6;
the control unit of the disconnector 2 that has determined the occurrence of the fault event switches in the receiving mode to wait for response data packages ACK1 or ACK2 from the control units of the other disconnectors 1, 3 for a seventh predefined time frame T7;
the control unit of the disconnector 2 that has determined the occurrence of the fault event switches in the transmission mode to broadcast trip-abort data packages TRA, if negative-response data packages ACK2 or no response data packages are received from the control units of the other disconnectors 1, 3 within the seventh time frame T7; or
the control unit of each disconnector 1, 2, 3 commands the sectioning of the related phase conductor L1, L2, L3 at the intervention instant TI, if no abort-data packages TRA are broadcasted by the control unit of the disconnector 2 that has determined the occurrence of the fault event before the intervention instant TI.

The apparatus and method, according to the invention, have remarkable advantages with respect to the state of the art.

In normal operative conditions for the power distribution network, the control units of the disconnectors are capable of cyclically providing data related to their operating conditions and/or related to the status of the power distribution network.

The control units of the disconnectors operate with a very low duty cycle values, which allows obtaining remarkable energy savings and avoiding data packet collisions.

In faulty operative conditions for the power distribution network, an effective and robust mechanism (procedures 102, and 103) is provided for managing the operation of the disconnectors, which operated in strict correlation with the actual status of the power distribution network.

Such a managing mechanism has the further benefit that a remarkably small number of data packets needs to be exchanged between the control units of the disconnectors.

In fact, such a managing mechanism allows to remarkably reduce the total number of messages exchanged among the disconnectors (said number is reduce to three messages in a best case scenario).

The disconnectors can thus be operated in a reliable manner, even if severe operative conditions for the power distribution network occur or even if severe time criticalities are present.

The apparatus and method, according to the invention, are particularly adapted for being employed in digitally enabled power distribution networks (smart grids).

Further, they provide improved connectivity with supervision systems or devices operatively associated to the power distribution network. This allows reducing costs in fault management and it allows collecting data related to the operations of the disconnectors and of the power distribution network with a higher level of granularity.

The apparatus and method, according to the invention, according to the invention, are of relatively easy and cost-effective realization at industrial level and practical implementation on the field.

The invention claimed is:

1. An apparatus (50) for sectioning the phase conductors (L1, L2, L3) of a multi-phase electric power distribution network (NET) comprising a plurality of disconnectors, each disconnector being operatively associated to a related phase conductor and comprising switching means for sectioning the related phase conductor and a control unit that is capable of controlling said switching means and is capable of wireless communicating with other remote devices;

wherein the control units of said disconnectors:
execute a normal-condition procedure, if the control unit of each disconnector determines the occurrence of normal conditions for said power distribution network, during said normal-condition procedure the control unit of each disconnector switching in turn between a transmission mode, in which said control unit broadcasts first data packages ($DP_1$) related to its operating conditions and/or the operating conditions of the power distribution network, and a turn-off mode, in which said control unit does not transmit or receive data packages from the control units of the other disconnectors;
execute a non-sectioning procedure, if the control unit of one disconnector determines the occurrence of a fault event and the occurrence of non-sectioning conditions for said power distribution network, during said non-sectioning procedure the control unit of each disconnector switching in turn between a transmission mode, in which said control unit broadcasts second data packages ($DP_2$) related to its operating conditions and/or the operating conditions of the power distribution network, and a receiving mode, in which said control unit waits for receiving the second data packages ($DP_2$) broadcasted by the control units of the other disconnectors;
execute a sectioning procedure, if the control unit of one disconnector determines the occurrence of a fault event and the occurrence of sectioning conditions for said power distribution network, during said sectioning procedure the control unit that has determined the occurrence of said fault event coordinating the control units of the other disconnectors, so that the control units of said disconnectors synchronously command the sectioning of the phase conductors of said power distribution network at a predetermined intervention time (TI).

2. An apparatus, according to claim 1, wherein the control units of said disconnectors execute a synchronization procedure to synchronize their internal clocks.

3. An apparatus, according to claim 2, wherein, during said synchronization procedure:
the control unit of a predefined disconnector switches in a transmission mode to broadcast synchronization data packages (TF) for a predetermined period of time;
the control units of the other disconnectors switch in a receiving mode to receive said synchronization data packages (TF) and synchronize their internal clocks on the base of said synchronization data packages (TF).

4. An apparatus, according to claim 1, wherein the control units of said disconnectors execute a determination procedure, during said determination procedure the control unit of each disconnector acquiring data (DS) related to the operating status of said power distribution network and determining the operating conditions of said power distribution network.

5. An apparatus, according to claim 1, wherein, during said normal-condition procedure, the control unit of each disconnector switches in turn in the transmission mode to broadcast said first data packages ($DP_1$) for a first predefined time frame (T1) and switches in turn in the turn-off mode for a second predefined time frame (T2), the control unit of each disconnector performing a switching cycle between said transmission mode and said turn-off mode, which has a duty cycle value $DC=T1/(T1+T2)$ that is less than 2%, where T1, T2 are said first and second time frames.

6. An apparatus, according to claim 1, wherein, during said non-sectioning procedure:
all the control units of said disconnectors simultaneously switch in a receiving mode for a predefined third time frame (T3);
and after said third time frame (T3) has elapsed:
the control unit of each disconnector switches in turn in the transmission mode to broadcast said second data packages ($DP_2$) for a fourth predefined time frame (T4);
the control unit of each disconnector switches in turn in a receiving mode to receive said second data packages ($DP_2$) for a fifth predefined time frame (T5).

7. An apparatus, according to claim 1, wherein, during said sectioning procedure:
the control unit that has determined the occurrence of said fault event switches in a transmission mode to broadcast tripping-request data packages (TRQ) for a sixth predefined time frame (T6);
the control unit that has determined the occurrence of said fault event switches in a receiving mode to wait for response data packages (ACK1, ACK2) from the control units of the other disconnectors for a seventh predefined time frame (T7);
the control unit that has determined the occurrence of said fault event switches in a transmission mode to broadcast trip-abort data packages (TRA), if negative-response data packages (ACK2) or no response data packages are received from the control units of the other disconnectors within said seventh time frame (T7); or
the control unit of each disconnector commands the sectioning of the related phase conductor at said intervention instant (TI), if no abort-data packages (TRA) are broadcasted by the control unit that has determined the occurrence of said fault event before said intervention instant (TI).

8. A method for sectioning the phase conductors of a multi-phase electric power distribution network (NET) comprising the step of:
providing a plurality of disconnectors, each disconnector being operatively associated to a related phase conductor and comprising switching means for sectioning the related phase conductor and a control unit that is capable of controlling said switching means and is capable of wireless communicating with other remote devices;
wherein it comprises the steps of:
executing a normal-condition procedure, if the control unit of each disconnector determines the occurrence of normal conditions for said power distribution network, during said normal-condition procedure the control unit of each disconnector switching in turn between a transmission mode, in which said control unit broadcasts first data packages ($DP_1$) related to its operating conditions and/or the operating conditions of the power distribution network, and a turn-off mode, in which said control unit does not transmit or receive data packages from the control units of the other disconnectors;
executing a non-sectioning procedure, if the control unit of one disconnector determines the occurrence of a fault event and the occurrence of non-sectioning conditions for said power distribution network, during said non-sectioning procedure the control unit of each disconnector switching in turn between a transmission mode, in which said control unit broadcasts second data packages ($DP_2$) related to its operating conditions and/ or the operating conditions of the power distribution network, and a receiving mode, in which said control unit waits for receiving the second data packages broadcasted by the control units of the other disconnectors;

executing a sectioning procedure, if the control unit of one disconnector determines the occurrence of a fault event and the occurrence of sectioning conditions for said power distribution network, during said sectioning procedure the control unit that has determined the occurrence of said fault event coordinating the control units of the other disconnectors, so that the control units of said disconnectors synchronously command the sectioning of the phase conductors of said power distribution network at a predetermined intervention time (TI), if this is possible.

9. A method, according to claim 8, wherein it comprises the step of executing a synchronization procedure, in which the control units of said disconnectors synchronize their internal clocks.

10. A method, according to claim 9, during said synchronization procedure:
the control unit of a predefined disconnector switches in a transmission mode to broadcast synchronization data packages (TF) for a predetermined period of time;
the control units of the other disconnectors switch in a receiving mode to receive said synchronization data packages (TF) and synchronize their internal clocks on the base of said synchronization data packages (TF).

11. A method, according to claim 8, wherein it comprises the step of executing a determination procedure, during said determination procedure the control unit of each disconnector acquiring data (DS) related to the operating status of said power distribution network and determining the operating conditions of said power distribution network.

12. A method, according to claim 8, wherein, during said normal-condition procedure, the control unit of each disconnector switches in turn in the transmission mode to broadcast said first data packages ($DP_1$) for a first predefined time frame (T1) and switches in turn in the turn-off mode for a second predefined time frame (T2), the control unit of each disconnector performing a switching cycle between said transmission mode and said turn-off mode, which has a duty cycle value $DC=T1/(T1+T2)$ that is less than 2%, where T1, T2 are said first and second time frames.

13. A method, according to claim 8, wherein, during said non-sectioning procedure:
all the control units of said disconnectors simultaneously switch in the receiving mode for a predefined third time frame (T3);
and after said third time frame (T3) has elapsed:
the control unit of each disconnector switches in turn in the transmission mode to broadcast said second data packages ($DP_2$) for a fourth predefined time frame (T4);
the control unit of each disconnector switches in turn in the receiving mode to receive said second data packages ($DP_2$) for a fifth predefined time frame (T5).

14. A method, according to claim 8, wherein, during said sectioning procedure:
the control unit of the disconnector that has determined the occurrence of said fault event switches in a transmission mode to broadcast tripping-request data packages (TRQ) for a sixth predefined time frame (T6);
the control unit that has determined the occurrence of said fault event switches in a receiving mode to wait for response data packages (ACK1, ACK2) from the control units of the other disconnectors for a seventh predefined time frame (T7);
the control unit that has determined the occurrence of said fault event switches in a transmission mode to broadcast trip-abort data packages (TRA), if negative-response data packages (ACK2) or no response data packages are received from the control units of the other disconnectors within said seventh time frame (T7); or
the control unit of each disconnector commands the sectioning of the related phase conductor at said intervention instant (TI), if no abort-data packages (TRA) are broadcasted by the control unit that has determined the occurrence of said fault event before said intervention instant (TI).

15. An apparatus, according to claim 2, wherein the control units of said disconnectors execute a determination procedure, during said determination procedure the control unit of each disconnector acquiring data (DS) related to the operating status of said power distribution network and determining the operating conditions of said power distribution network.

16. An apparatus, according to claim 3, wherein the control units of said disconnectors execute a determination procedure, during said determination procedure the control unit of each disconnector acquiring data (DS) related to the operating status of said power distribution network and determining the operating conditions of said power distribution network.

17. An apparatus, according to claim 2, wherein, during said normal-condition procedure, the control unit of each disconnector switches in turn in the transmission mode to broadcast said first data packages ($DP_1$) for a first predefined time frame (T1) and switches in turn in the turn-off mode for a second predefined time frame (T2), the control unit of each disconnector performing a switching cycle between said transmission mode and said turn-off mode, which has a duty cycle value $DC=T1/(T1+T2)$ that is less than 2%, where T1, T2 are said first and second time frames.

18. An apparatus, according to claim 3, wherein, during said normal-condition procedure, the control unit of each disconnector switches in turn in the transmission mode to broadcast said first data packages ($DP_1$) for a first predefined time frame (T1) and switches in turn in the turn-off mode for a second predefined time frame (T2), the control unit of each disconnector performing a switching cycle between said transmission mode and said turn-off mode, which has a duty cycle value $DC=T1/(T1+T2)$ that is less than 2%, where T1, T2 are said first and second time frames.

19. An apparatus, according to claim 4, wherein, during said normal-condition procedure, the control unit of each disconnector switches in turn in the transmission mode to broadcast said first data packages ($DP_1$) for a first predefined time frame (T1) and switches in turn in the turn-off mode for a second predefined time frame (T2), the control unit of each disconnector performing a switching cycle between said transmission mode and said turn-off mode, which has a duty cycle value $DC=T1/(T1+T2)$ that is less than 2%, where T1, T2 are said first and second time frames.

20. An apparatus, according to claim 2, wherein, during said non-sectioning procedure:
all the control units of said disconnectors simultaneously switch in a receiving mode for a predefined third time frame (T3);
and after said third time frame-(T3) has elapsed:

the control unit of each disconnector switches in turn in the transmission mode to broadcast said second data packages ($DP_2$) for a fourth predefined time frame (T4);

the control unit of each disconnector switches in turn in a receiving mode to receive said second data packages ($DP_2$) for a fifth predefined time frame (T5).

* * * * *